(12) United States Patent
Tamura

(10) Patent No.: US 8,456,155 B2
(45) Date of Patent: Jun. 4, 2013

(54) RADIO-FREQUENCY POWER AMPLIFIER

(75) Inventor: Tetsuro Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 266 days.

(21) Appl. No.: 13/051,637

(22) Filed: Mar. 18, 2011

(65) Prior Publication Data

US 2011/0234204 A1  Sep. 29, 2011

(30) Foreign Application Priority Data

Mar. 25, 2010 (JP) ................ 2010-069279

(51) Int. Cl.
*G01R 1/30* (2006.01)

(52) U.S. Cl.
USPC ............ 324/123 R; 257/123; 257/107

(58) Field of Classification Search
None
See application file for complete search history.

(56) References Cited

U.S. PATENT DOCUMENTS

2005/0083135 A1  4/2005 Honda
2008/0231383 A1* 9/2008 Chang et al. ............. 331/108 R
2009/0256637 A1* 10/2009 Ishihara et al. ............. 330/289

FOREIGN PATENT DOCUMENTS

JP    06-258404 A    9/1994
JP    2005-123764 A    5/2005

* cited by examiner

*Primary Examiner* — Jermele M Hollington
*Assistant Examiner* — Trung Nguyen
(74) *Attorney, Agent, or Firm* — Arent Fox LLP

(57) ABSTRACT

A power amplifier includes: an input matching circuit including an inductor, the input matching circuit receiving an input signal and matching input impedances with each other; an amplifier amplifying the input signal that is passed through the input matching circuit; and a test circuit, wherein the test circuit includes: a capacitor connected to the inductor in the input matching circuit through first test switch; a negative resistance transistor provided between the inductor and first voltage source terminal with second test switch being interposed between the inductor and the negative resistance transistor; and a current source transistor provided between second voltage source terminal and the inductor, wherein, in testing, first and second test switches and the current source transistor are turned on to cause the inductor and the test circuit to form a oscillator and, in normal operation, first and second test switches and the current source transistor are turned off.

13 Claims, 12 Drawing Sheets

RADIO-FREQUENCY POWER AMPLIFIER

CROSS REFERENCE TO RELATED APPLICATION

This application is based upon and claims the benefit of priority from the prior Japanese Patent Application NO. 2010-069279 filed on Mar. 25, 2010, the entire contents of which are incorporated herein by reference.

FIELD

The embodiments discussed herein are related to a radio-frequency power amplifier.

BACKGROUND

A radio-frequency power amplifier that amplifies the power of a radio-frequency signal is provided in the front end of a mobile communication terminal, for example, and amplifies the power of a radio-frequency output signal. Such a radio-frequency power amplifier is described in Japanese Laid-Open Patent Publication No. 2005-123764, for example.

Japanese Laid-Open Patent Publication No. 6-258404 descries a digital integrated circuit that contains an on-chip oscillator circuit and outputs a radio-frequency signal in response to an external control signal.

A power amplifier amplifies an input signal in a predetermined frequency band requested by specifications to a predetermined amplitude (gain) requested by the specifications. Therefore, testing of the power amplifier involves inputting a radio-frequency input signal in a predetermined frequency band into the power amplifier to test the power of a radio-frequency output signal, test for a signal distortion, and measure current consumption.

During the testing, generally a radio-frequency test probe is connected to a wafer-level device to provide a radio-frequency input signal to the device and an amplified radio-frequency output signal is obtained through another test probe similar to the former.

However, the radio-frequency test probes are expensive. In addition, it is structure-wise difficult to test multiple device chips with many test probes at a time because the test probes need to be brought into contact with the device chips at the same time. The costly testing method leads to high prices of power amplifiers.

SUMMARY

According to one aspect of the embodiments, a following radio-frequency power amplifier is provided. The radio-frequency power amplifier includes an input matching circuit including at least one inductor, the input matching circuit receiving an input signal and matching input impedances with each other; an amplifier amplifying the input signal that has passed through the input matching circuit; and a test circuit. The test circuit include a capacitor configured to be connected to the inductor in the input matching circuit through a first test switch; a negative resistance transistor provided between the inductor and a first voltage source terminal with a second test switch being interposed between the inductor and the negative resistance transistor; and a current source transistor provided between a second voltage source terminal and the inductor.

In testing, the first and second test switches and the current source transistor are turned on to cause the inductor and the test circuit to form a radio-frequency oscillator and, in normal operation, the first and second test switches and the current source transistor are turned off.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
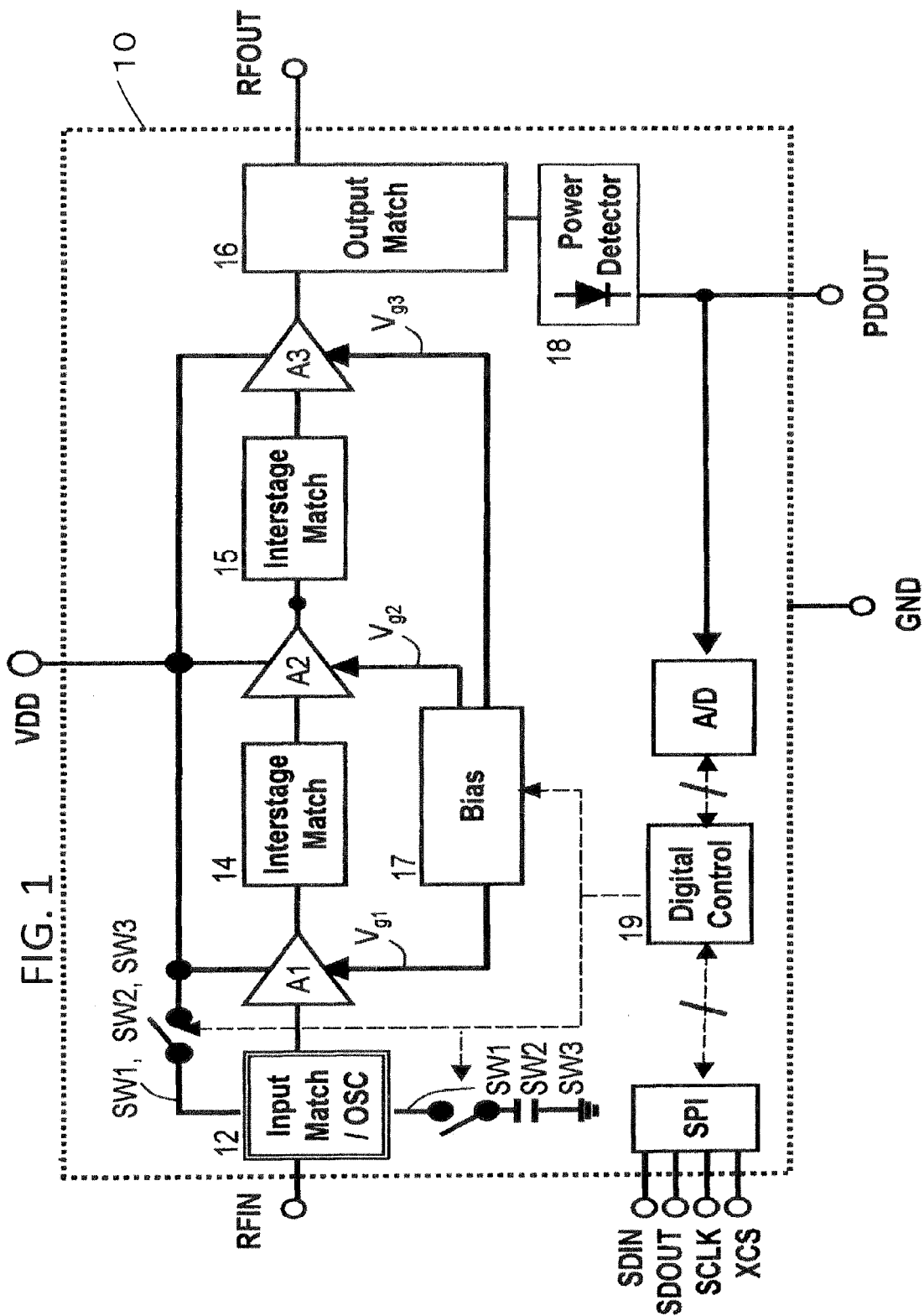
FIG. 1 is a block diagram generally illustrating a radio-frequency power amplifier according to an embodiment.

FIG. 1 is a block diagram generally illustrating a radio-frequency power amplifier according to an embodiment. The radio-frequency power amplifier 10 includes a ground terminal GND as a first voltage source terminal and a power supply terminal VDD as a second voltage source terminal. Ground lines in the chip are omitted from FIG. 1. A radio-frequency input signal RFIN is input into a first-stage amplifier circuit A1 through an input matching circuit 12. In the example in FIG. 1, three amplifier circuits A1, A2 and A3 are connected through matching circuits 14 and 15 between them. The amplifier circuits A1, A2 and A3 in turn amplify the amplitude of the radio-frequency input signal RFIN and an output from the third-stage amplifier circuit A3 is output from the radio-frequency power amplifier as an output signal RFOUT through an output matching circuit 16. Bias voltages Vg1, Vg2 and Vg3 are supplied from a bias generation circuit 17 to the amplifier circuits A1, A2 and A3, respectively.

A serial-to-parallel interface SPI receives an input serial data SDIN and outputs a parallel digital data to a controller 19. Based on the parallel digital data, the controller 19 controls a bias voltage value to be generated by bias generation circuit 17.

According to the present embodiment, an LC oscillator circuit may be configured with an inductor in the input matching circuit 12. Specifically, a test circuit, which will be describe later, is provided next to the input matching circuit 12 and control signals SW1, SW2 and SW3 are generated under the control of the controller 19 during testing to connect the test circuit to the inductor to configure an oscillator circuit. An oscillatory signal generated by the oscillator circuit is input into the amplifier circuit A1 as a test input signal.

The radio-frequency power amplifier 10 further includes a power detector 18 which detects power (or output voltage or gain) of an output signal so that the detected output power (or output voltage or gain) may be monitored through a power output terminal PDOUT as an analog voltage without conversion. Furthermore, the detected output power (or output voltage or gain) is converted by an analog-to-digital converter A/D to a digital signal, which is then serially output from a serial data output terminal SDOUT through the interface SPI. A synchronous clock SCLK and chip select signal XCS are input in the interface SPI.

Figure 2:
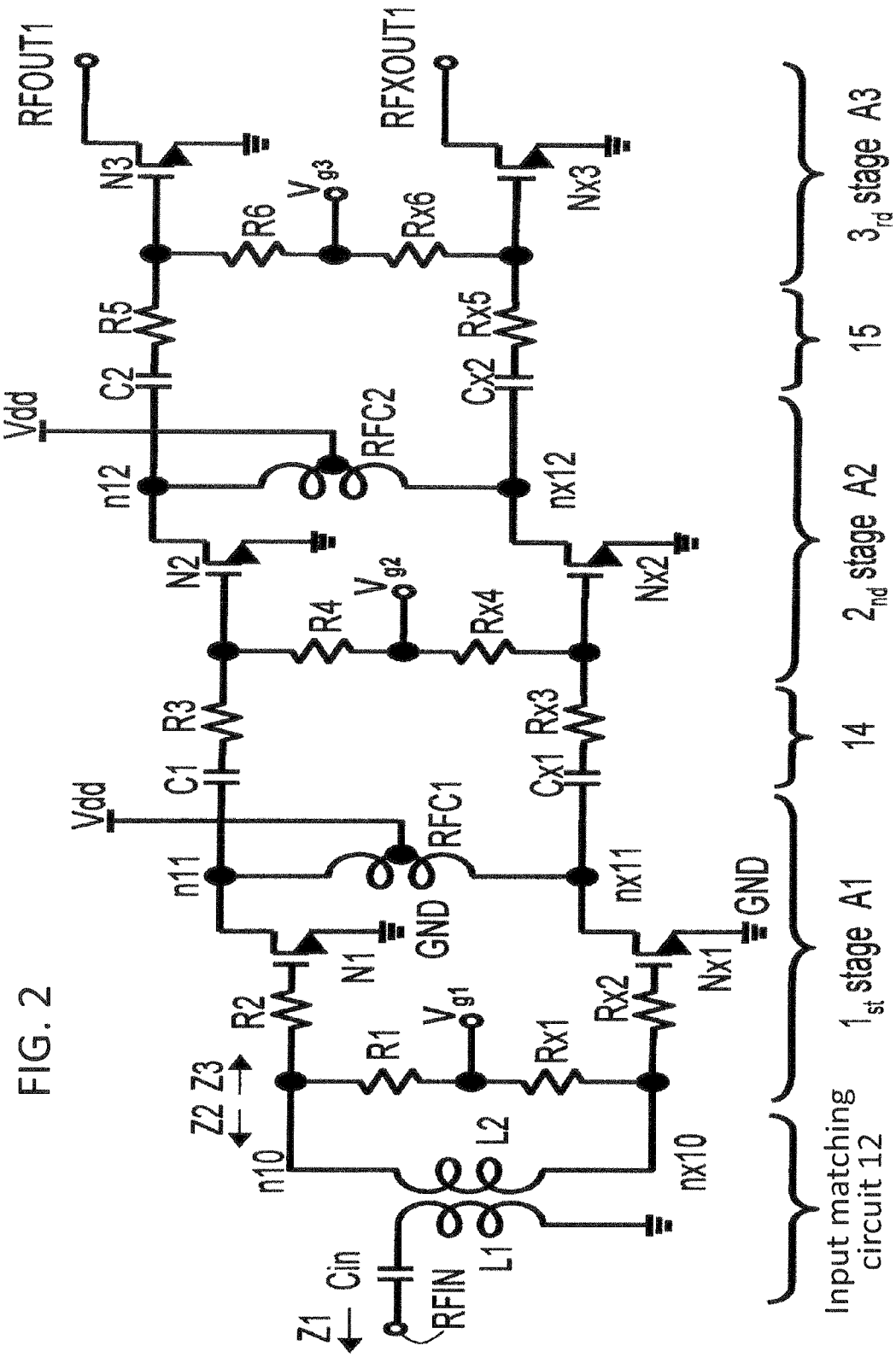
FIG. 2 is a circuit diagram of three amplifier circuits of the radio-frequency power amplifier according to the embodiment.

FIG. 2 illustrates the three amplifier circuits of the radio-frequency power amplifier according to the present embodiment. The input matching circuit 12, the three amplifier circuits A1, A2 and A3, and the matching circuits 14 and 15 between them are depicted in FIG. 2.

The input matching circuit 12 includes an input capacitor Cin and a transformer including primary and secondary inductors L1 and L2. When a radio-frequency input signal RFIN is input into the primary inductor L1, the transformer converts the radio-frequency input signal RFIN into a voltage that is proportional to the number of turns of the inductors L1 and L2 and to a current that is inversely proportional to the number of turns. For example, a voltage of 2V1 and a current of I1/2 are generated between both ends n10 and nx10 of the inductor L2 for a voltage V1 and a current I1 of the inductor L1. Accordingly, impedance Z2 viewed from the secondary inductor L2 becomes higher than the input impedance Z1=V1/I1 at the input signal RFIN terminal by a factor of 4: Z2=4V1/I1=4*Z1. As a result, the converted input impedance Z2 matches with a high input impedance Z3 at a gate of the first-stage amplifier circuit A1.

Radio-frequency signals that have the same frequency as the input signal RFIN and opposite phases are generated between the ends n10 and nx10 of the secondary inductor L2 of the transformer. The radio-frequency signals having opposite phases are amplified by N-channel transistors N1 and Nx1 of the first-stage amplifier circuit A1, N-channel transistors N2 and Nx2 of the second-stage amplifier circuit A2, and N-channel transistors N3 and Nx3 of the third-stage amplifier circuit A3 as illustrated in FIG. 2. Accordingly, a radio-frequency differential signal is amplified by the three amplifier circuits A1, A2 and A3 in sequence. If the gain of each amplifier circuit is X dB, the signal will be amplified by a gain of 3× dB in total.

The first-stage amplifier circuit A1 includes N-channel amplifying transistors N1 and Nx1 having gates which receive radio-frequency signals having opposite phases generated at the ends n10 and nx10 of the inductor L2, relatively large resistances R1 and Rx1 to which a gate bias voltage Vg1 is provided, relatively small gate resistances R2 and Rx2, and an RF choke coil RFC1 provided between the drain terminals n11, nx11 of the transistors N1, Nx1 and the power supply Vdd terminal. The radio-frequency signals having opposite phases generated at the ends n10 and nx10 of the inductor L2 are amplified by the transistors N1 and Nx1, respectively, and the amplified radio-frequency signals having opposite phases RFOUT1 and RFOUT2 appear at drain terminals n11 and nx11.

The second-stage amplifier circuit A2 is connected to the output terminals n11 and nx11 of the first-stage amplifier circuit A1 through the matching circuit 14 including capacitors C1 and Cx1 and resistances R3 and Rx3. The second-stage amplifier circuit A2 has a configuration equivalent to that of the first-stage amplifier circuit A1. A gate bias voltage Vg2 is applied to the gates of the N-channel transistors N2 and Nx2 through resistances R4 and Rx4. An RF choke coil RFC2 is provided at drain terminals n12 and nx12. Radio-frequency signals that appear at the output terminals n11 and nx11 of the first-stage amplifier circuit A1 are amplified and the amplified radio-frequency signals appear at the drain terminals n12 and nx12.

Figure 3:
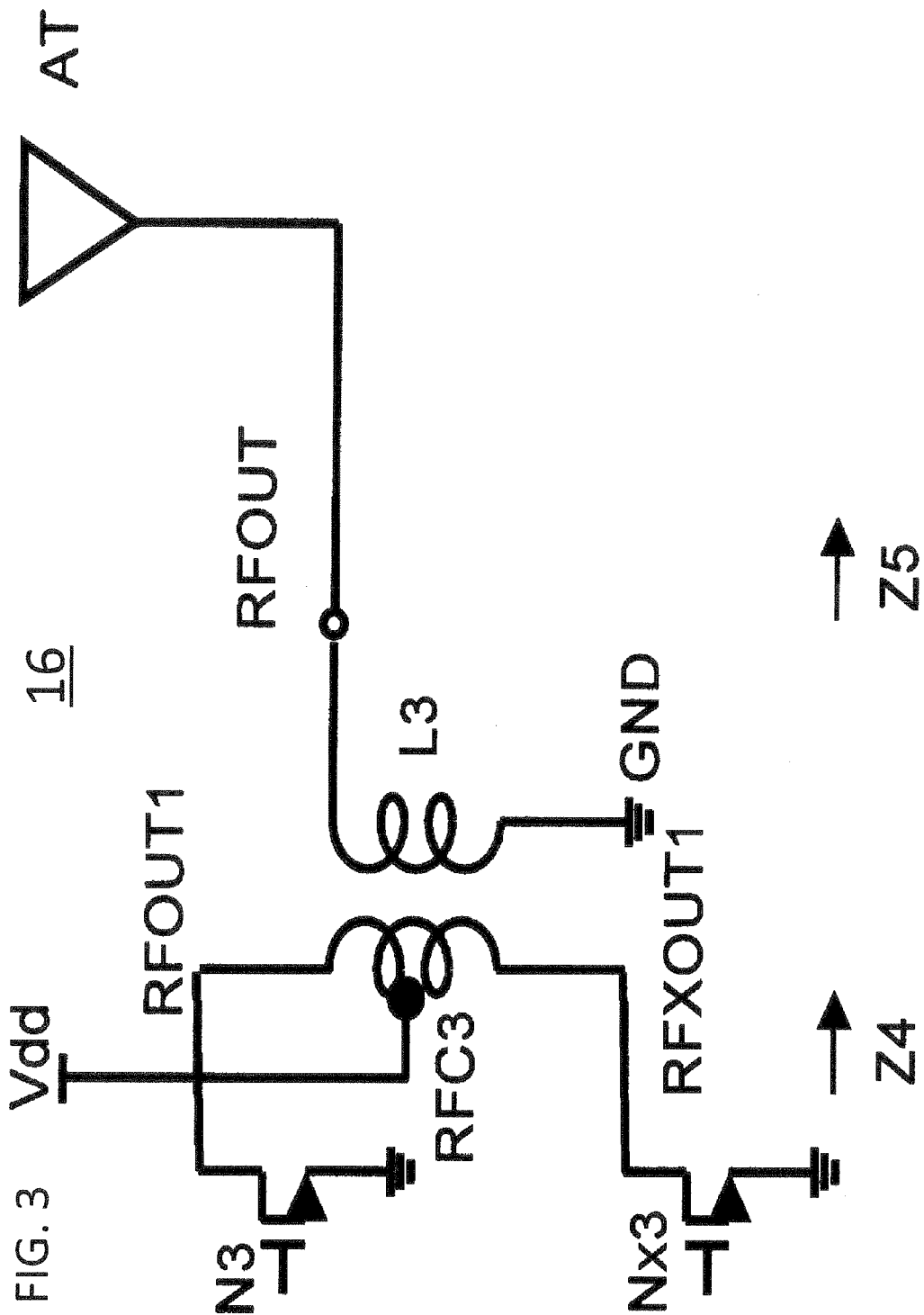
FIG. 3 is a circuit diagram of an output matching circuit of the power amplifier.

The third-stage amplifier circuit A3 is connected to the output terminals n12 and nx12 of the second-stage amplifier circuit A2 through the matching circuit 15 including capacitors C2 and Cx2 and resistances R4 and Rx4. The third-stage amplifier circuit A3 has a configuration equivalent to that of the first-stage amplifier circuit A1. A gate bias voltage Vg3 is applied to the gates of the N-channel transistors N3 and Nx3 through resistances R6 and Rx6. An RF choke coil RFC3 is provided at the drain terminals of the transistors N3 and Nx3 as depicted in FIG. 3. Radio-frequency signals that appear at the output terminals n12 and nx12 of the second-stage amplifier circuit A2 are amplified and amplified radio-frequency signals RFOUT1 and RFXOUT1 appear at the drain terminals.

The gain of the input radio-frequency signal RFIN is variably controlled to variably control the gain of the power amplifier. The gate bias voltages Vg1, Vg2 and Vg3 are set to optimum values and cause the power amplifier to amplify the input radio-frequency signal RFIN by an identical gain regardless of the gain of the input radio-frequency signal.

FIG. 3 is a circuit diagram of the output matching circuit 16 of the power amplifier. The RF choke coil RFC3 is provided between the drain terminals of the third-stage amplifying transistors N3 and Nx3. The choke coil RFC3 functions as a primary inductor. The primary inductor RFC3 and a secondary inductor L3 form a transformer. The secondary inductor L3 is provided between an output RFOUT and a ground GND. The output RFOUT becomes a single-phase radio-frequency output signal and is applied to an antenna AT.

The output matching circuit 16 increases an output impedance Z4 by a factor of 4, if the numbers of turns of the inductors RFC3 and L3 of the transformer are in a ratio of 1:16, for example, to generate an output impedance Z5=4*Z4. Accordingly, by choosing appropriate number of turns of each inductor of the transformer, the output impedance Z5 may be matched to the impedance of the antenna.

Figure 4:
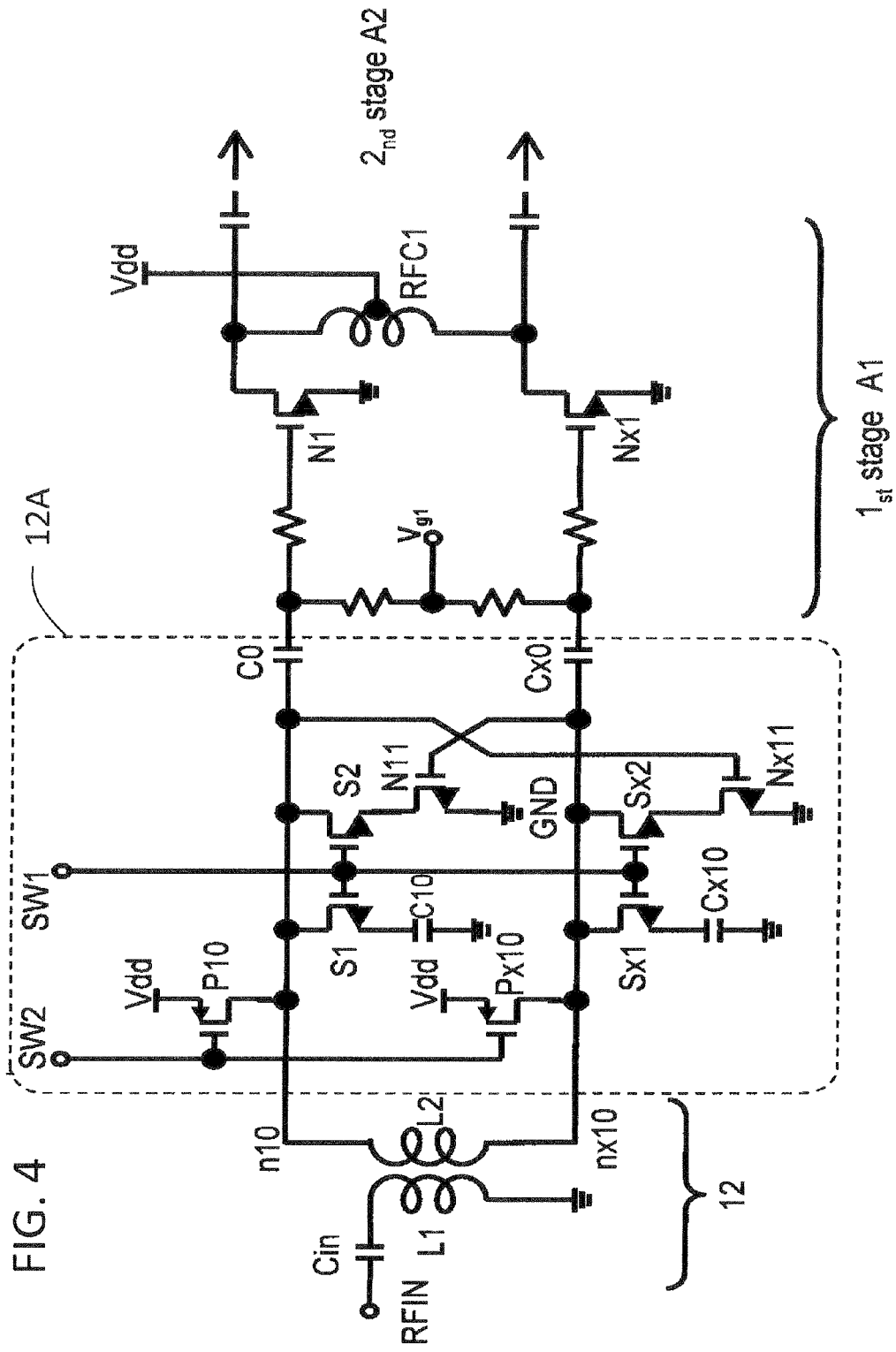
FIG. 4 is a circuit diagram of a power amplifier according to a first embodiment.

FIG. 4 is a circuit diagram of a power amplifier according to a first embodiment. A test circuit 12A is provided at the inductor L2 in the input matching circuit 12 of the power amplifier illustrated in FIG. 2. The test circuit 12A includes a pair of capacitors C10 and Cx10, a pair of negative resistance transistors N11 and Nx11, and a pair of current source transistors P10 and Px10. The capacitors C10 and Cx10 are connected between the end n10 and nx10, respectively, of the inductor L2 and a first voltage source terminal GND, which is ground, through first switches S1 and Sx1, respectively. The negative resistance transistor N11 and Nx11 are provided between the ends n10 and nx10, respectively, of the inductor L2 and the first voltage source terminal GND with second test switches S2 and Sx2 being provided between the ends n10, nx10 and the negative resistance transistors N11, Nx11. The current source transistors P10 and Px10 are provided between the end n10 and nx10, respectively, of the inductor L2 and a second voltage source terminal Vdd which is a power supply voltage.

The first and second test switches S1, Sx1, S2 and Sx2 and the negative resistance transistors N11 and Nx11 are implemented by N-channel transistors. The current source transistors P10 and Px10 are implemented by P-channel transistors. The first and second test switches S1, Sx1, S2 and Sx2 are turned on and off by a control signal SW1. Similarly, the current source transistors P10 and Px10 are turned on and off by a control signal SW2.

Alternatively, the first test switches S1 and Sx1 may be provided between the capacitors C10, Cx10 and the ground GND. In that case, the capacitors C10 and Cx10 do not operate when the first test switches are turned off. When the first test switches are turned on, the capacitors C10 and Cx10 are connected to the ends n10 and nx10 of the inductor L2.

In normal operation, the voltage of the control signal SW is 0V and the voltage of the control signal SW2 is equal to power supply voltage Vdd in FIG. 4, so that the first and second test switches S1 and Sx1, S2 and Sx2 and the current source transistors P10 and Px10 are all in the off state. Accordingly, the input matching circuit 12 of the power amplifier, is configured in the same way as the circuit illustrated in FIG. 2.

On the other hand, when testing is conducted, the voltage of the control signal SW1 is set to the power supply voltage Vdd and the voltage of the control signal SW2 is set to 0V, so that the first and second test switches S1 and Sx1, S2 and Sx2 and the current source transistors P10 and Px10 are all turned on. As a result, the pair of capacitors C10 and Cx10, the current source transistors P10 and Px10, and negative resistance transistors N11 and Nx11 are connected to the inductor L2 to form an LC oscillator circuit. The LC oscillator circuit has a configuration illustrated in FIG. 5.

Figure 5:
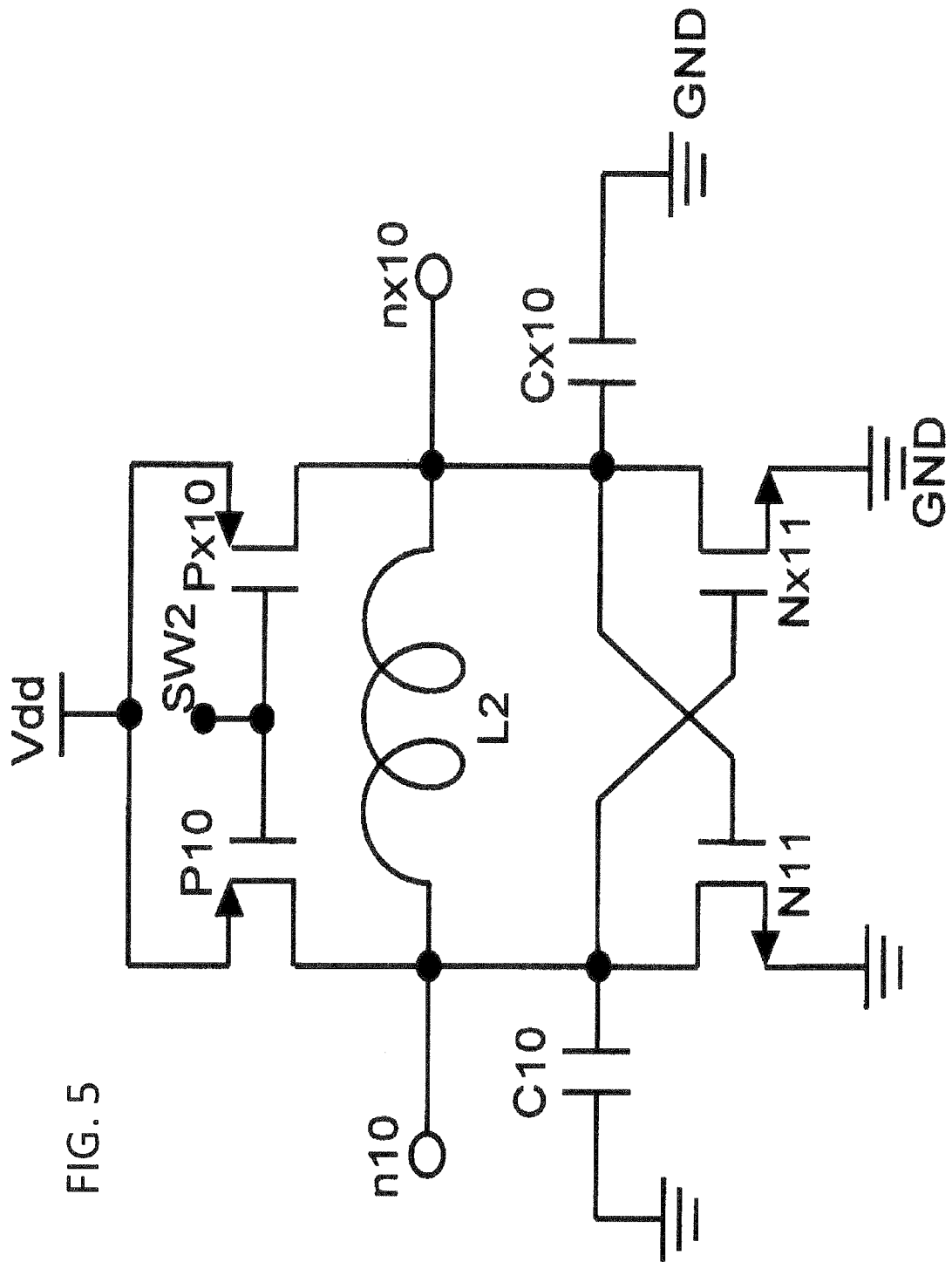
FIG. 5 is a circuit diagram of an LC oscillator circuit according to the first embodiment.

FIG. 5 is a circuit diagram of an LC oscillator circuit in the first embodiment. The LC oscillator circuit in FIG. 5 is formed when the first and second test switches S1 and Sx1, S2 and Sx2 and the current source transistors P10 and Px10 in the test circuit 12A illustrated in FIG. 4 are all turned on. The first and second test switches S1 and Sx1, S2 and Sx2 are omitted from FIG. 5.

The LC oscillator circuit includes a pair of capacitors C10 and Cx10 connected to the ends of an inductor L2 to form an LC circuit. The LC oscillator circuit further includes current source transistors P10 and Px10, each having a gate to which a control signal SW2 (0 V) is applied, and negative resistance transistors N11 and Nx11, each having a gate and drain cross-connected to a drain and gate of the other negative resistance transistor. Each of the negative resistance transistors N11 and Nx11 has a function equivalent to a negative resistance because the drain current decreases as the voltage of the drain terminal n10, nx10 increases whereas the drain current increases as the voltage of the drain terminal n10, nx10 decreases. The current source transistors and the negative resistance transistors enable the LC circuit to continue oscillating.

Referring back to FIG. 4, the inductor L2 in the input matching circuit 12 and the test circuit 12A forms the LC oscillator circuit illustrated in FIG. 5. The LC oscillator circuit generates radio-frequency signals having opposite phases at the drain terminals n10 and nx10. Since the LC oscillator circuit generates radio-frequency input signals having opposite phases during testing, there is no need to provide a radio-frequency input signal RFIN from a source external to the chip through a test prove. In addition, since the LC oscillator circuit uses inductors provided in the input matching circuit 12, there is no need to provide extra inductors dedicated to the oscillator circuit. Accordingly, the LC oscillator circuit may be included in a chip without adding inductor elements that occupy a relatively large area in the chip.

The oscillatory frequency of the LC oscillator circuit is unsusceptible to variations in characteristics of transistors caused by process variations as compared with a ring oscillator made up of inverters connected in a ring.

In testing, the voltage of the control signals SW1 and SW2 are controlled to the power supply voltage Vdd or a ground voltage of 0 V by the controller 19 in FIG. 1 to allow radio-frequency input signals generated by the LC oscillator circuit to be input to the gates of the transistors N1 and Nx1 of the first-stage amplifier circuit A1 of the power amplifier. With the radio-frequency input signals, the power amplifier may be checked to determine whether the power amplifier properly operate, for example whether the power amplifier is able to provide proper output power, and whether current consumption in the power amplifier is within a specified range.

Figure 6:
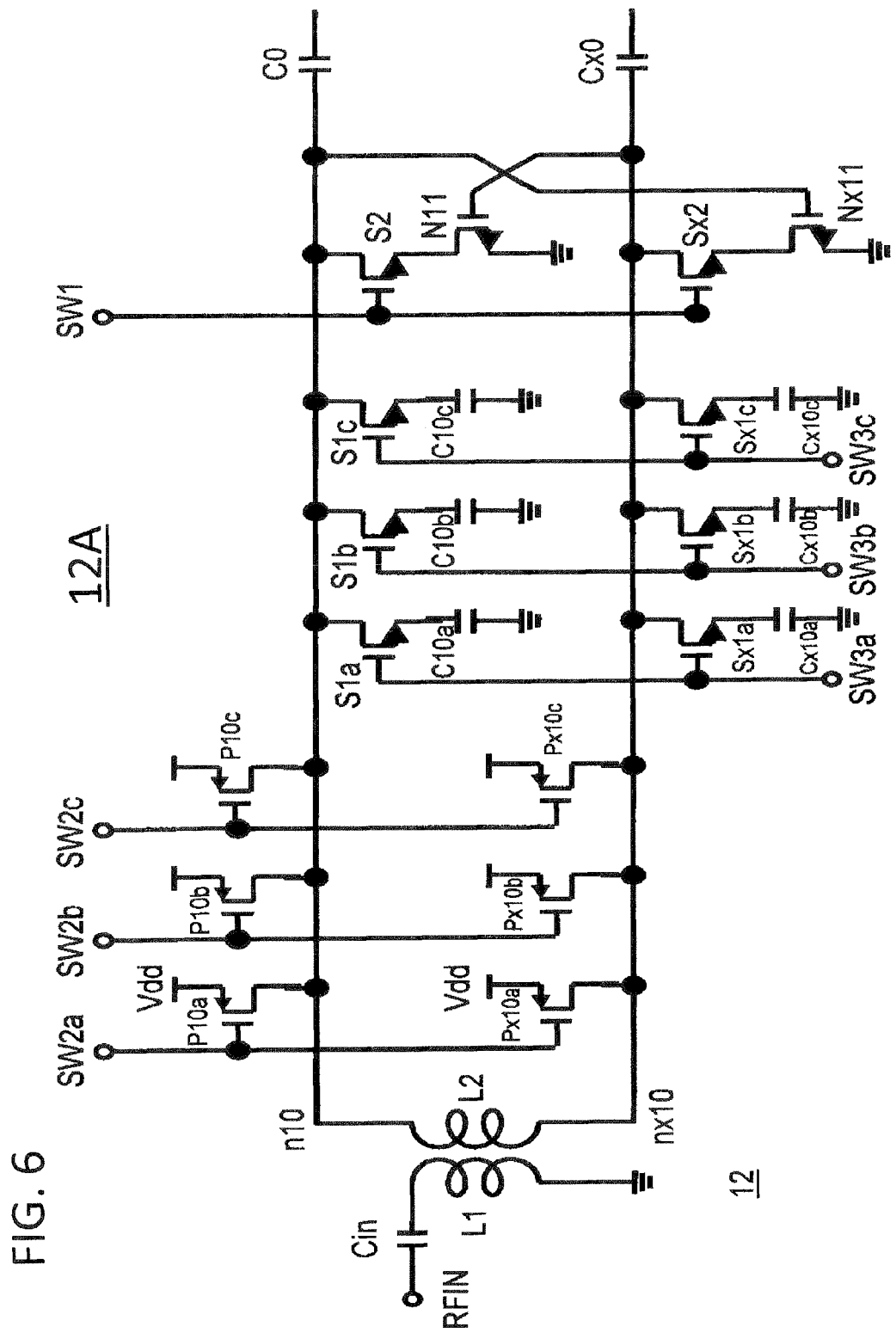
FIG. 6 is a diagram illustrating a variation of a test circuit according to the first embodiment.

FIG. 6 illustrates a variation of a test circuit of the first embodiment. The variation includes three sets of test switches S1, Sx1 and capacitors C10, Cx10: S1$a$, Sx1$a$, C10$a$, Cx10$a$, S1$b$, Sx1$b$, C10$b$, Cx10$b$, S1$c$, Sx1$c$, C10$c$ and Cx10$c$. The ratio of capacitances of the capacitors is set to $1:2:2^2$, for example. Any of the three pairs of capacitors may be selected using frequency control signals SW3$a$, SW3$b$ and SW3$c$ as appropriate to change the capacitance value of the CL oscillator circuit in 8 levels. By the variable control of the capacitance values of the capacitors, the frequency $f=\frac{1}{2}\pi\sqrt{(CL)}$ of the LC oscillator circuit may be variably controlled. The frequency of the LC oscillator circuit lowers as the capacitance value of the capacitors increases.

While the control signal SW1 controls the test switches in FIG. 4, a signal SW1 in the variation in FIG. 6 controls switches S2 and Sx2 and separate signals SW3$a$, SW3$b$ and SW3$c$ control the switches S1$a$ and Sx1$a$, S1$b$ and Sx1$b$, and S1$c$ and Sx1$c$, respectively.

Furthermore, three sets of current source transistors P10, Px10 are provided in the variation: P10$a$ and P10$xa$, P10$b$ and Px10$b$, and P10$c$ and Px10$c$. The gate width ratio among the current source transistors is set to $1:2:2^2$, for example. By using gain control signals SW2$a$, SW2$b$ and SW2$c$ to choose an appropriate total gate width of the three sets of current source transistors, the amplitude (gain) of an output signal of the CL oscillator circuit may be changed in 7 levels. The amplitude (gain) of the output signal increases as the total gate width of the current source transistors is increased.

Figure 7:
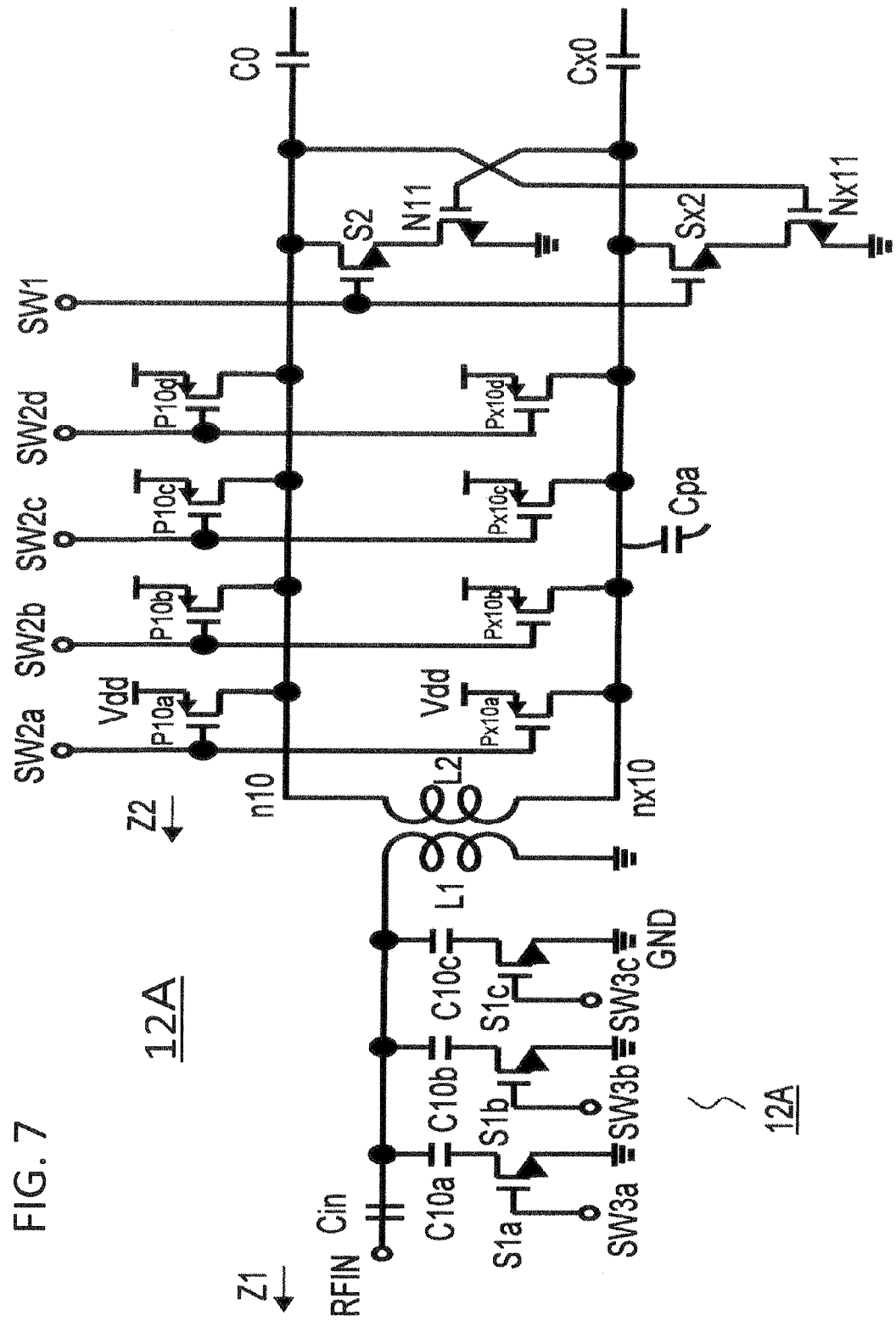
FIG. 7 is a circuit diagram of a power amplifier according to a second embodiment.

FIG. 7 is a circuit diagram of a power amplifier according to a second embodiment. A test circuit 12A is provided at inductors L1 and L2 in an input matching circuit 12 of the power amplifier which is the same as the one illustrated in FIG. 2. In the test circuit 12A, capacitors C10$a$, C10$b$ and C10$c$ are provided at terminals of the inductor L1 that are opposite from a ground GND. The capacitors are connected between the inductor L1 and the ground GND through first test switches S1$a$, S1$b$ and S1$c$, respectively. The test circuit 12A further includes a pair of negative resistance transistors N11, Nx11 and current source transistors P10, Px10. The negative resistance transistors N11 and Nx11 are provided between the ends n10 and nx10, respectively, of an inductor L2 and a first voltage source terminal GND with second test switches S2 and Sx2, respectively, between the ends n10, nx10 and the inductor L2. The current source transistors P10, Px10 are provided between a power supply voltage Vdd and the ends n10 and nx10, respectively, of the inductor L2. Four pairs of current source transistors P10$a$ and Px10$a$, P10$b$ and Px10$b$, P10$c$ and Px10$c$, and P10$d$ and Px10$d$ are provided.

As in the first embodiment illustrated in FIGS. 4 and 6, the first and second test switches and the current source transistors are turned off in normal operation and are turned on in testing.

In the second embodiment in FIG. 7, the three capacitors C10$a$, C10$b$ and C10$c$ are connected between the primary inductor L1 and the ground GND through first switches S1a, S1b and S1c, respectively. The ratio of the capacitances of the capacitors is set to 1:2:2², for example. In this way, impedance Z2 viewed from the ends n10 and nx10 of the inductor L2 may be fine-adjusted in normal operation. In testing, the oscillator formed by the current source transistors P10, Px10, negative transistors N11, Nx11, and a parasitic capacitance Cpa oscillates by charging and discharging any of capacitors C10a, C10b and C10c that are connected with a current at the primary inductor L1 in response to a current caused at the secondary inductor L2. Thus, the oscillatory frequency f may be changed according to the number of the connected capacitors.

In the second embodiment, as in the first embodiment, the ratio among the capacitances of the three capacitors C10a, C10b and C10c is set to 1:2:2², any of the three capacitors are selected by frequency control signals SW3a, SW3b and SW3c to change the capacitance value in 8 levels. In this way, the impedance Z2 is fine-adjusted in normal operation whereas the frequency of the LC oscillator circuit is fine-adjusted in testing. Similarly, the gate width ratio among the four pairs of current source transistors P10a and Px10a, P10b and Px10b, P10c and Px10c, and P10d and Px10d is set to 1:2:2²:2³ and the total gate width may be changed in 15 levels by gain control signals SW2a, SW2b, SW2c and SW2d. This enables variable control of the amplitude (gain) of the oscillation signal.

The test circuit 12A of the second embodiment does not request providing capacitors at both ends of the inductor L2 and therefore occupies a small area in a chip. Furthermore, the test circuit 12A of the second embodiment enables fine-adjustment of input impedance in addition to oscillatory frequency.

Figure 8:
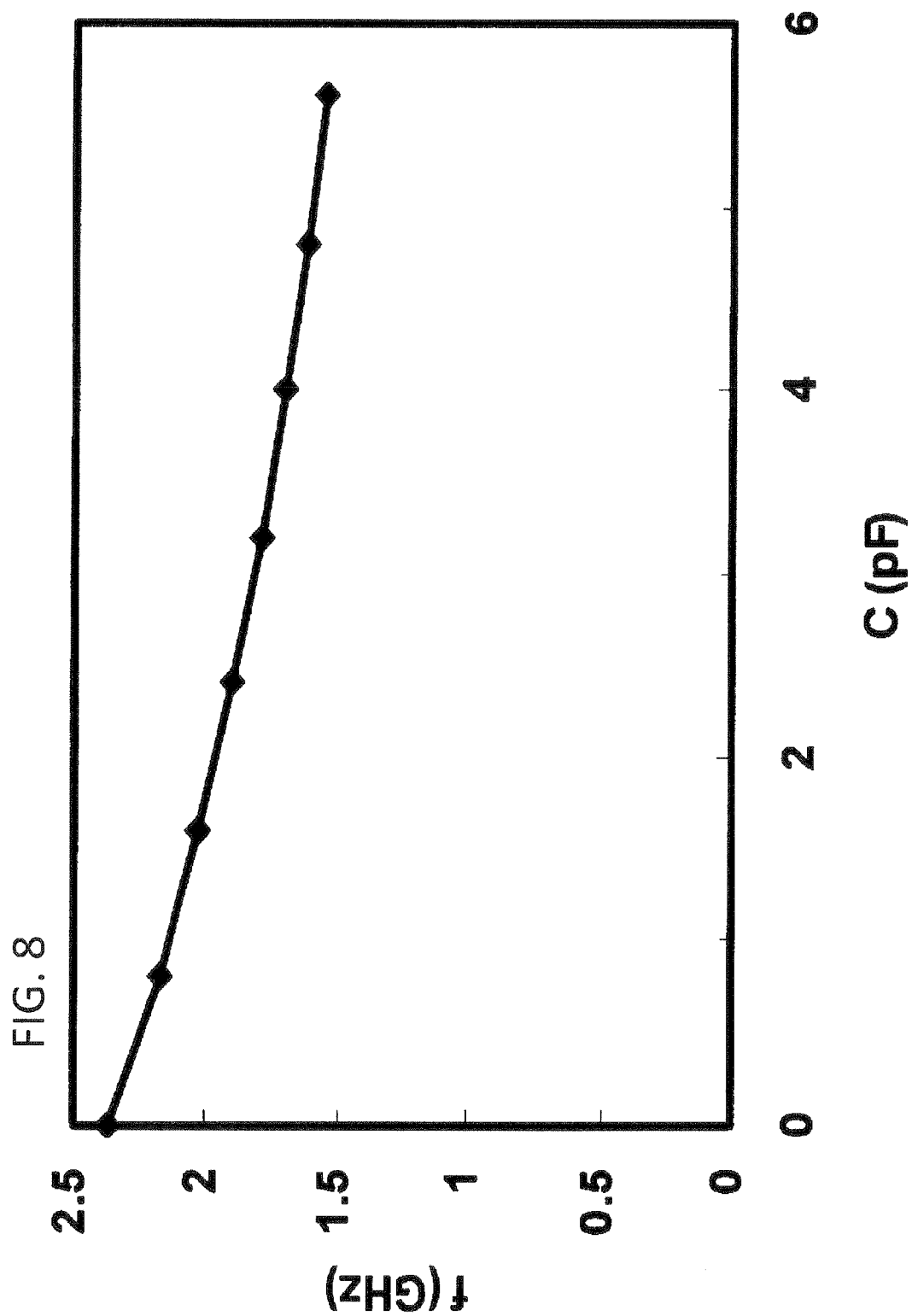
FIG. 8 is a diagram illustrating an exemplary characteristic of an oscillating operation of the test circuit in FIG. 6.
Figure 9:
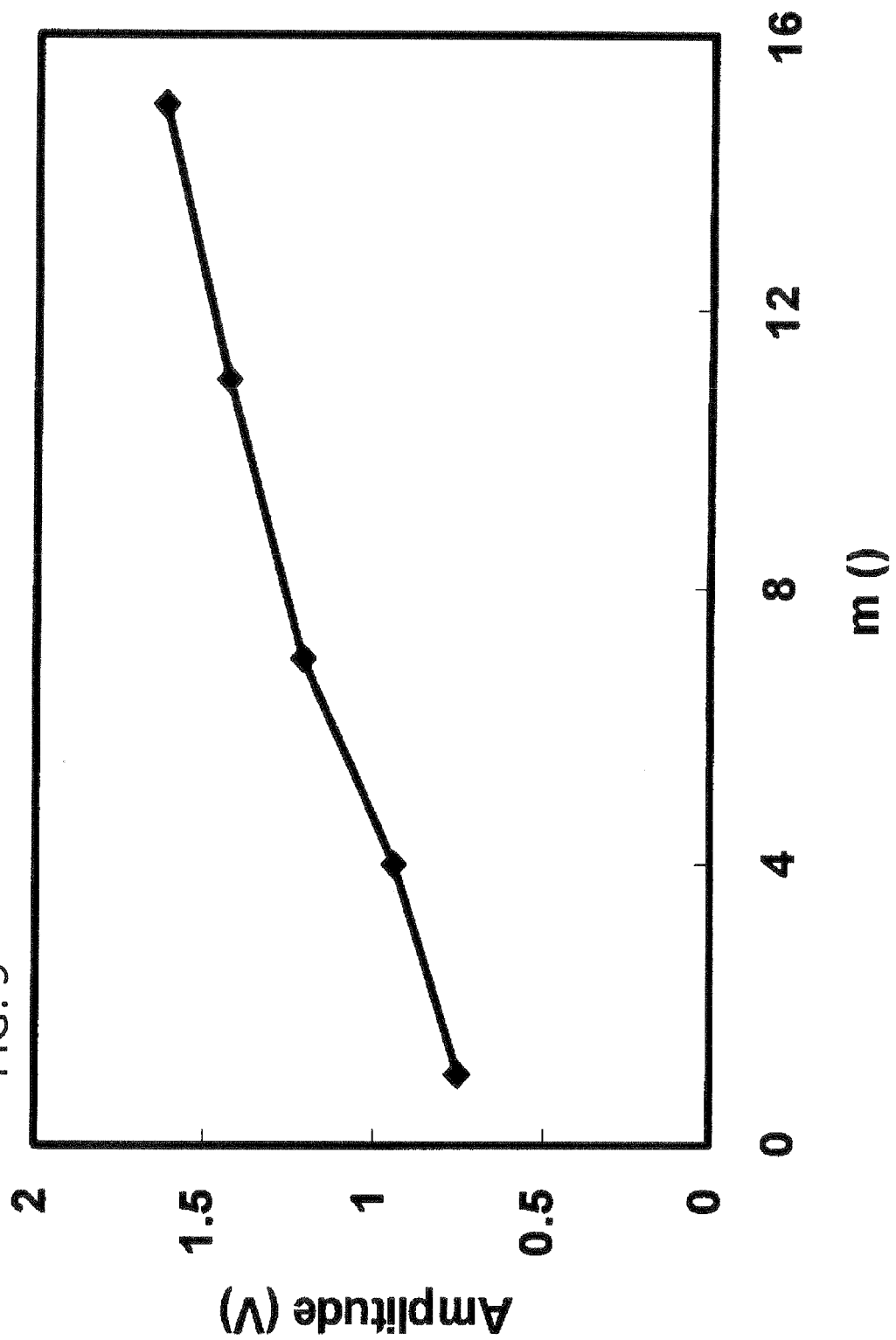
FIG. 9 is a diagram illustrating another exemplary characteristic of the oscillating operation of the test circuit in FIG. 6.

FIGS. 8 and 9 illustrate exemplary characteristics of an oscillation operation by the test circuit in FIG. 6. In the test circuit in FIG. 6, in testing, the controller 19 in FIG. 1 sets the voltage of the control signal SW1 to a power supply Vdd on the basis of a digital signal SDIN input from a testing device. As a result, the negative resistance transistors N11 and Nx11 in the test circuit 12A, the inductor L2 and the parasitic capacitance form an oscillator.

By setting the voltage of any of the frequency control signals SW3a, SW3b and SW3c to the power supply voltage Vdd from the testing device through the controller 19, the capacitance value of the capacitors C10, Cx10 is changed to adjust the frequency of the oscillation signal. FIG. 8 illustrates oscillatory frequency, on the vertical axis, versus capacitance value, on the horizontal axis.

By setting the voltage of any of the gain control signals SW2a, SW2b and SW2c to the ground voltage GND from the testing device through the controller 19, the gate width of the current source transistors P10, Px10 is changed to adjust the amplitude (gain) of the oscillation signal. FIG. 9 illustrates gain of oscillation signal, on the vertical axis, versus gate width of current supply transistors, on the horizontal axis.

When the parasitic capacitance of the transistors of switches S2, Sx2 is 8 pF and the capacitance value of the capacitors C10, C10x is 0.8 to 0.6 pF in FIG. 6, the output amplitude may be changed in the range of 0.5 to 2.0 V and the frequency may be changed in the range of 1.9 to 2.0 GHx as illustrated in FIGS. 8 and 9.

In a preparatory process for testing, a radio-frequency input signal RFIN having a known gain is input from an external source, output power of the power amplifier is detected with the detector, and any of the current source transistors in the LC oscillator circuit is selected by the test circuit so that the output power equal to that output power may be obtained. As a result, the gain of an oscillation signal of the internal LC oscillator circuit may be properly controlled to a desired gain.

Then, in the testing, the test device variably sets a capacitance value of the capacitors with a frequency control signal so that the frequency of the LC oscillator circuit falls within a frequency range specified in the specifications for the power amplifier and variably sets the number of current source transistors with a gain control signal so that the intensity of the signal from the LC oscillator circuit is changed in the range of the intensity of an input signal RFIN specified in the specifications for the power amplifier. The detector detects output power or the maximum output power of the power amplifier in the testing.

Figure 10:
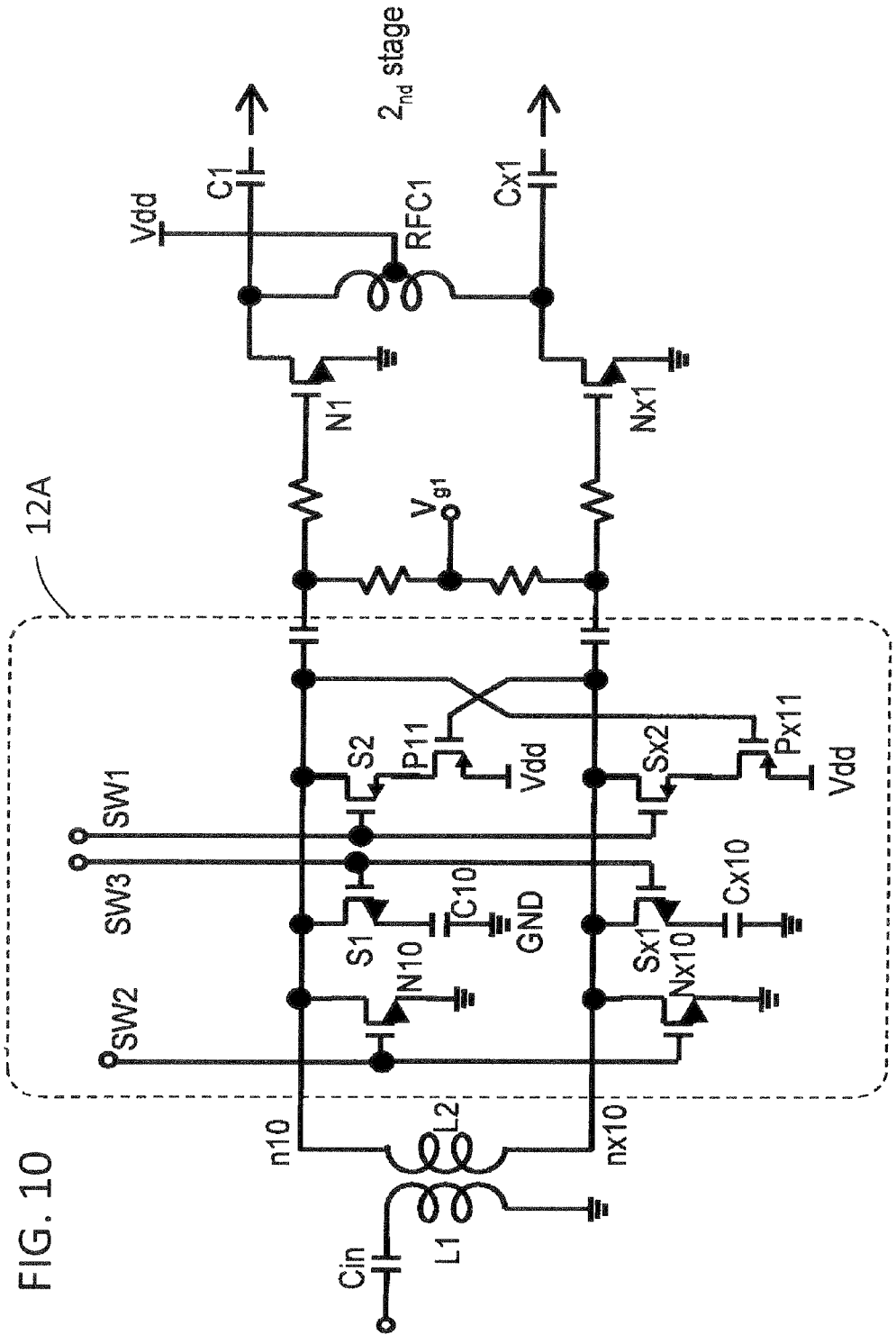
FIG. 10 illustrates a variation of the power amplifier of the first embodiment.
Figure 11:
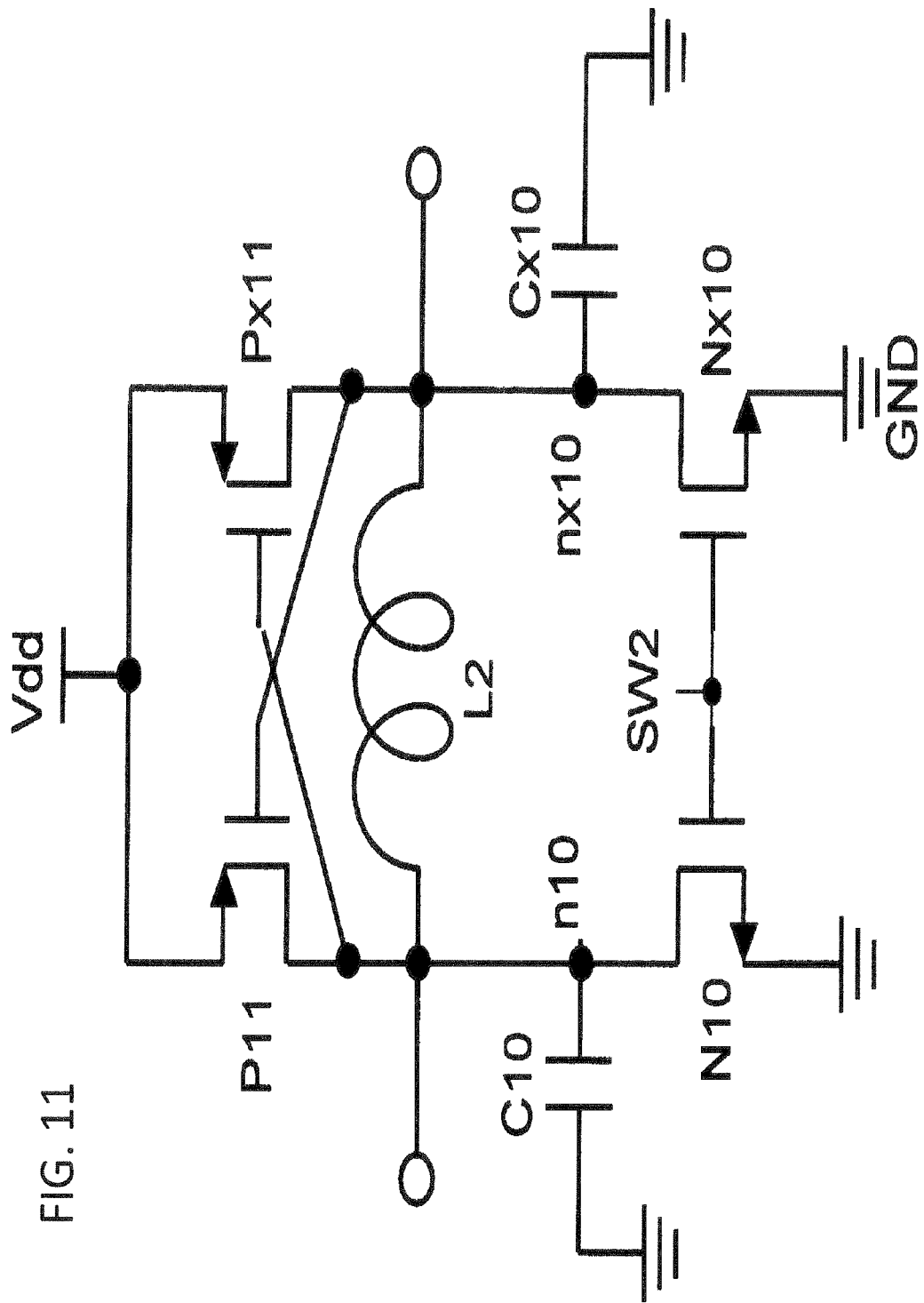
FIG. 11 is a circuit diagram of an LC oscillator of the variation.

FIG. 10 illustrates a variation of the power amplifier of the first embodiment. FIG. 11 is a circuit diagram of an LC oscillator. As may be seen from FIGS. 10 and 11, the LC oscillator formed by a test circuit 12A and an inductor L2 includes negative resistance transistors P11, Px11 implemented by P-channel transistors and current source transistors N10, Nx10 implemented by N-channel transistors. That is, the P-channel transistors in FIGS. 4 and 5 are replaced with N-channel transistors and the N-channel transistors in FIGS. 4 and 5 are replaced with P-channel transistors. Accordingly, the second test switch S2 is also implemented by P-channel transistor. The voltage of the control signal SW1 is controlled to a ground voltage of 0V in testing and to a power supply voltage Vdd in normal operation. The control signals SW2, SW3 are the same as those in FIG. 4.

As in the variation in FIG. 10, in the test circuits of the power amplifiers in FIGS. 6 and 7, the negative resistance transistors may be implemented by P-channel transistors and the current source transistors may be implemented by N-channel transistors.

Figure 12:
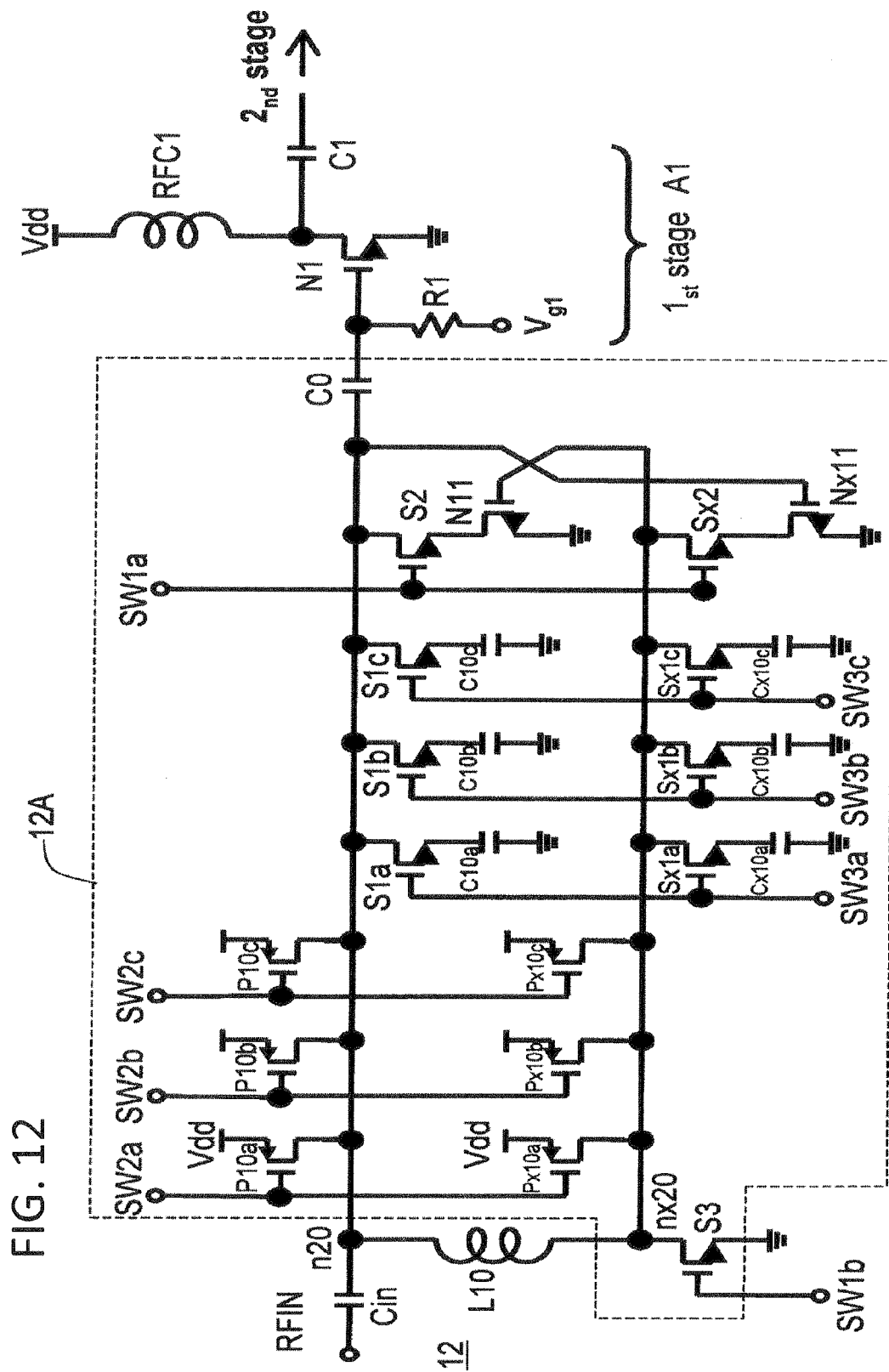
FIG. 12 is a circuit diagram of a power amplifier according to a third embodiment.

FIG. 12 is a circuit diagram of a power amplifier according to a third embodiment. The power amplifier includes an input matching circuit 12 including an input capacitor Cin and an inductor L10, and a single-phase amplifier circuit A1 including an amplifying transistor N1 and an RF choke RFC1. A radio-frequency input signal RFIN is input from a node N20 into the gate of the amplifying transistor N1 through a capacitor C0. A gate bias voltage Vg1 is provided to the gate of the amplifying transistor N1 through a resistance R1.

The power amplifier includes a test circuit 12A connected to both terminals n20 and nx20 of the inductor L10. The inductor L10 in the input matching circuit 12 and the test circuit 12A forms an LC oscillator circuit. The test circuit 12A is the same as that in FIG. 6 except switches S3. The LC oscillator circuit is equivalent to that in FIG. 5.

In normal operation, the voltage of a control signal SW1a is controlled to 0 V to turn off the switch S2, the voltage of SW1b is controlled to Vdd to turn on the switch S3, the voltages of SW2a, SW2b and SW2c are controlled to vdd to turn off the current source transistors P10, Px10k, and the voltages of SW3a, SW3b and SW3c are controlled to 0 V to turn off the switches S1a Sx1a, S1b, Sx1b, S1c and Sx1c. Accordingly, the inductor L10 forms an input matching circuit and a radio-frequency input signal RFIN is amplified by three amplifier circuits A1, A2 and A3 (A2 and A3 are not depicted).

In testing, on the other hand, the voltage of the control signal SW1a is controlled to Vdd to turn on the switch S2 and the voltage of SW1b is controlled to 0 V to turn off the switch S3 to form the LC oscillator circuit. Any combination of SW2a, SW2b, SW2c is controlled to 0V to turn on any pair of current source transistors P10a and Px10a, P10b and Px10b, and P10c and Px10c to control the gain of an oscillation output signal to a desired value, and any combination of SW3a, SW3b and SW3c is controlled to Vdd to turn on any pair of switches S1a and Sx1a, S1b and Sx1b, and S1c and Sx1c to control the frequency of the oscillation output signal to a desired value.

As in FIG. 10, in the third embodiment in FIG. 12, the P-channel transistors in the test circuit 12A may be replaced with N-channel transistors and the N-channel transistors may be replaced with P-channel transistors to configure an LC oscillator circuit as illustrated in FIG. 11.

According to the present embodiments, an on-chip LC oscillator circuit with a high frequency-accuracy and a on-chip output power detector are included as a self-test circuit in a power amplifier to eliminate the need to supply a radio-frequency input signal from outside of the chip through a probe. Therefore the cost of testing of the power amplifier may be reduced. Furthermore, since the on-chip LC oscillator circuit uses inductors of the input matching circuit provided in the power amplifier, an extra inductor dedicated to the LC oscillator circuit does not need to be provided and therefore an increase of the chip size may be avoided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio-frequency power amplifier comprising:
   an input matching circuit including at least one inductor, the input matching circuit receiving an input signal and matching input impedances with each other;
   an amplifier amplifying the input signal that is passed through the input matching circuit; and
   a test circuit, wherein the test circuit comprises:
   a capacitor configured to be connected to the inductor in the input matching circuit through a first test switch;
   a negative resistance transistor provided between the inductor and a first voltage source terminal with a second test switch being interposed between the inductor and the negative resistance transistor; and
   a current source transistor provided between a second voltage source terminal and the inductor, and
   wherein, in testing, the first and second test switches and the current source transistor are turned on to cause the inductor and the test circuit to form a radio-frequency oscillator and, in normal operation, the first and second test switches and the current source transistor are turned off.

2. The radio-frequency power amplifier according to claim 1, wherein:
   the capacitor includes a pair of capacitors configured to be connected to both ends of the inductor through the first test switch;
   the negative resistance transistor includes first and second negative resistance transistors, one of the first and second negative resistance transistors being connected to one end of the inductor through the second switch and the other being connected to the other end of the inductor through the second switch, a gate of each of the first and second negative resistance transistors being cross-connected to a drain of the other of the first and second negative resistance transistors; and
   the current source transistor includes first and second current source transistors, one of the first and second current source transistors being provided between one of the ends of the inductor and the second voltage source, the other of the first and second current source transistors being provided between the other of the ends of the inductor and the second voltage source; and
   the radio-frequency oscillator formed in the testing generates radio-frequency signals having opposite phases at both ends of the inductor.

3. The radio-frequency power amplifier according to claim 1, wherein:
   a plurality of sets of the first test switch and the capacitor are provided; and
   in the testing, the plurality of first test switches are selectively turned on by a frequency control signal to variably control an oscillatory frequency of the radio-frequency oscillator.

4. The radio-frequency power amplifier according to claim 1, wherein:
   a plurality of sets of the current source transistors are provided; and
   in the testing, the plurality of current source transistors are selectively turned on by a gain control signal to variably control a gain of an output signal of the radio-frequency oscillator.

5. A radio-frequency power amplifier comprising:
   an input matching circuit including a transformer outputting a differential input signal to both ends of a secondary inductor in response to an input signal input into a primary inductor;
   first and second amplifying transistors, each amplifying the differential input signal; and
   a test circuit, wherein the test circuit comprises:
   a pair of capacitors, one of which is configured to be connected to one of both terminals of the secondary inductor through a first test switch and the other of which is configured to be connected to the other of the terminals through the first test switch;
   first and second negative resistance transistors, one of which is provided between one of both ends of the secondary inductor and a first voltage source terminal with a second test switch being interposed between the terminal and the negative resistance transistor and the other of which is provided between the other end of the secondary inductor and the first voltage source terminal with the second test switch being interposed between the terminal and the negative resistance transistor; and
   a pair of current source transistors, one of which is provided between a second voltage source terminal and one of both terminals of the secondary inductor and the other of which is provided between the second voltage source terminal and the other of the terminals, and
   wherein, in testing, the first and second test switches and the pair of current source transistors are turned on to cause the inductor and the test circuit to form a radio-frequency oscillator and, in normal operation, the first and second test switches and the pair of current source transistors are turned off.

6. The radio-frequency power amplifier according to claim 5, wherein:
   a plurality of sets of the first test switch and the capacitor are provided; and in the testing, the plurality of first test switches are selectively turned on by a frequency control signal to variably control an oscillatory frequency of the radio-frequency oscillator.

7. The radio-frequency power amplifier according to claim 5, wherein:
   a plurality of the pairs of current source transistors are provided; and
   in the testing, the plurality of pairs of current source transistors are selectively turned on by a gain control signal to variably control the intensity of an output signal of the radio-frequency oscillator.

8. A radio-frequency power amplifier comprising:
   an input matching circuit including a transformer outputting a differential input signal to both ends of a secondary inductor in response to an input signal input into a primary inductor;
   first and second amplifying transistors, each amplifying the differential input signal; and
   a test circuit, wherein the test circuit comprises:
   a capacitor configured to be connected to the primary inductor through a first test switch;
   first and second negative resistance transistors, one of which is provided between one of both ends of the secondary inductor and a first voltage source terminal with a second test switch being interposed between the terminal and the negative resistance transistor and the other of which is provided between the other end of the secondary inductor and the first voltage source terminal with the second test switch being interposed between the terminal and the negative resistance transistor, a gate of each of the first and second negative resistance transistors being cross-connected to a drain of the other of the first and second negative resistance transistors; and
   a pair of current source transistors, one of which is provided between a second voltage source terminal and one of both terminals of the secondary inductor and the other of which is provided between the second voltage source terminal and the other of the terminals, and
   wherein, in testing, the first and second test switches and the pair of current source transistors are turned on to cause the inductor and the test circuit to form a radio-frequency oscillator and, in normal operation, the first and second test switches and the pair of current source transistors are turned off.

9. The radio-frequency power amplifier according to claim 8, wherein:
   a plurality of sets of the first test switch and the capacitor are provided; and
   in the testing, the plurality of first test switches are selectively turned on by a frequency control signal to variably control an oscillatory frequency of the radio-frequency oscillator.

10. The radio-frequency power amplifier according to claim 8, wherein:
    a plurality of the pairs of current source transistors are provided; and
    in the testing, the plurality of pairs of current source transistors are selectively turned on by a gain control signal to variably control the intensity of an output signal of the radio-frequency oscillator.

11. The radio-frequency power amplifier according to claim 1, further comprising:
    a power detector detecting the power of a radio-frequency output signal of the amplifying transistors; and
    an output power terminal outputting power detected by the power detector to the outside of the radio-frequency power amplifier.

12. The radio-frequency power amplifier according to claim 1, further comprising a controller turning on the first and second test switches and the pair of current source transistors in the testing.

13. The radio-frequency power amplifier according to claim 3, further comprising a controller providing the frequency control signal or the amplitude control signal to the first switch or the current source transistors depending on a control signal from an external source in the testing.

* * * * *